United States Patent [19]

Wang et al.

[11] Patent Number: 4,991,140
[45] Date of Patent: Feb. 5, 1991

[54] INTEGRATED CIRCUIT MEMORY WITH IMPROVED DI/DT CONTROL

[75] Inventors: Karl L. Wang; Ray Chang, both of Austin, Tex.

[73] Assignee: Motorola, Inc., Schaumburg, Ill.

[21] Appl. No.: 460,776

[22] Filed: Jan. 4, 1990

[51] Int. Cl.[5] .................................................. G11C 7/00
[52] U.S. Cl. ................................ 365/203; 365/189.05; 365/233.5; 307/465; 307/480; 307/481
[58] Field of Search ............. 307/480, 481, 465, 233.5; 365/189.05, 203

[56] References Cited

U.S. PATENT DOCUMENTS

| | | | |
|---|---|---|---|
| 4,573,147 | 2/1986 | Aoyama et al. | 365/233.5 |
| 4,616,344 | 10/1986 | Noguchi et al. | 365/203 |
| 4,724,340 | 2/1988 | Sood | 307/443 |
| 4,758,743 | 7/1988 | Dehganpour et al. | 307/443 |
| 4,800,298 | 1/1989 | Yu et al. | 307/443 |
| 4,881,241 | 11/1989 | Tanaka et al. | 365/233.5 |
| 4,893,276 | 1/1990 | Okuyama | 365/233.5 |

OTHER PUBLICATIONS

S. Kayano et al., "25 MS 256K×1/64k×4 CMOS SRAM's," IEEE J. of S. S. Crts, Vol. SC-21, #5, Oct. 1986, pp. 686-690.
A 21-NS 32K×8 CMOS Static RAM with a Selectively Pumped P-Well Array, by Karl Wang et al, IEEE Journal of Solid State Circuits, vol. SC-22, No. 5, Oct. 1987.

Primary Examiner—Joseph E. Clawson, Jr.
Attorney, Agent, or Firm—Paul J. Polansky

[57] ABSTRACT

An integrated circuit memory with improved di/dt control. The memory stores a plurality of data bits at intersections of word lines and bit line pairs. In response to a change in at least one of a plurality of address signals during a read cycle, first and second precharge signals are asserted, the second precharge signal asserted after the first precharge signal. An output buffer provides a data output signal at a voltage between a logic high and a logic low voltage in response to an assertion of the second precharge signal, and provides said data output signal corresponding to a voltage on an enabled bit line pair in response to a negation of the first precharge signal. Thus, the voltage on the data output signal changes less when the data bit is provided during the data period. The memory thus improves di/dt for a given access time, or conversely, allows reduced access time for a given di/dt.

13 Claims, 3 Drawing Sheets

INTEGRATED CIRCUIT MEMORY WITH IMPROVED DI/DT CONTROL

FIELD OF THE INVENTION

This invention relates generally to integrated circuit memories, and more particularly, to integrated circuit memories which use address transition detection.

BACKGROUND OF THE INVENTION

As integrated circuit, there is generally a piece of silicon known as a die or chip which contains electrical circuit and which is connected to a lead frame. The chip has bonding pads which connected to the lead frame by tiny wires. The lead frame has leads which are used for connecting to a printed circuit board as part of a larger system. The leads of the lead frame have a certain amount of inductance as well ad capacitance and resistance. There is also some inductance in the wire from the bonding pad to the lead frame. The wire inductance, however, is significantly less than that of the lead frame. The connection of a lead of the lead frame to a circuit board also adds some inductance. As the switching speeds of integrated circuits have increased, this cumulative inductance has begun to have an impact on the performance of the integrated circuit.

Of course it is desirable to have integrated circuits which are very fast. The increased switching speed has also increased the rate at which current changes. This increased rate of current change causes a voltage drop across the inductance. The voltage across an inductance is equal to the inductance times the time rate of change of the current through that inductance. This is expressed as Ldi/dt, where L is the inductance and di/dt is the time rate of change of the current. As the di/dt becomes larger, the voltage across the inductance becomes larger. This voltage drop across an inductance causes a voltage differential between the lead location on the circuit board and the bonding pad to which it is connected on the integrated circuit. This can create a problem of having an internal supply at a different voltage than the voltage of a corresponding external supply. This problem can cause the internal supply voltages to differ by so much from their external levels that signals input to the chip are recognized incorrectly.

Conventional method of reducing di/dt focus on output buffers themselves. (See Wang, Karl L., et. al, "A 21-ns 32Kχ8 CMOS Static RAM with a selectively Pumped p-Well Array, " IEE Journal of Solid-State Circuits, vol. SC-22, no. 5, October 1987; Wang, et al. in a U.S. patent application Ser. No. 07/348357 entitled "A Low di/dt Output Buffer with Improved Speed". ) In integrated circuit memories, there is a tradeoff between access time and di/dt. As access times are force down, new approaches must be found to reduce di/dt for a given access time.

BRIEF DESCRIPTION OF THE INVENTION

Accordingly, it is an object of the present invention to provide an integrated circuit memory with improved di/dt control.

It is another object of the present invention to provide a memory with acceptable di/dt and improved access time.

In carrying out these and other objects of the invention, there is provided, in one form, an integrated circuit memory comprising a plurality of memory cells, a row decoding portion, a column decoding portion, an address transition detection portion, and an output buffer portion. The plurality of memory cells are located at intersections of a plurality of word lines and a plurality of bit line pairs, each memory cell selected by an enabled word line and an enabled bit line pair, and providing a pair of complementary bit line signals when selected. The row decoding portion is coupled to the word lines, and enables a word line in response to a plurality of row address signals. The column decoding portion is coupled to the plurality of bit line pairs, and enables a bit line pair in response to a plurality of column address signals. The address transition detection portion provides first and second precharge signals in response to a change in logic state of either, at least one of the plurality of row address signals and the plurality of column address signals, or at least one control signal, the second precharge signal being provided after the first precharge signal. The output buffer portion is coupled to the column decoding portion and to the address transition detection portion, and provides a data output signal at a voltage substantially between a logic high voltage and a logic low voltage in response to the second precharge signal and a sensed voltage on the data output signal, and provides the data output signal at either the logic high or the logic low voltage corresponding to a voltage on the enabled bit line pair in response to a negation of the first precharge signal.

These and other objects, features and advantages will be more clearly understood from the following detailed description taken in conjunction with the accompanying drawings.

DETAILED DESCRIPTION OF THE INVENTION

Figure 1:
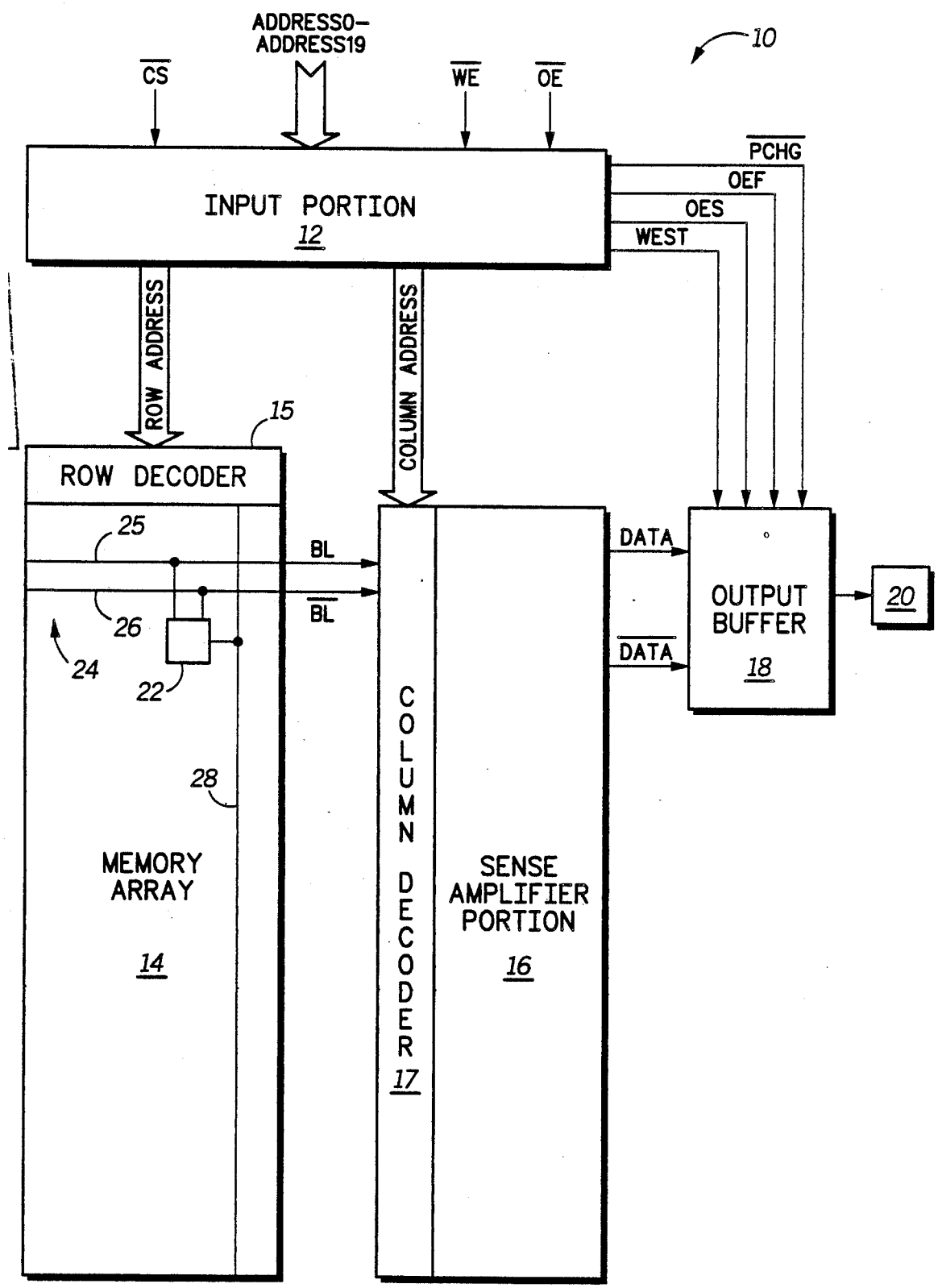
FIG. 1 shows a block diagram of an integrated circuit memory in accordance with a preferred embodiment of the present invention.

FIG. 1 shows a block diagram of an integrated circuit memory 10 in accordance with a preferred embodiment of the present invention. Memory 10 comprises an input portion 12, a memory array 14, a row decoder 15, a sense amplifier portion 16, a column decoder 17, an output buffer 18, and a bonding pad 20. Shown in memory array 14 is a representative memory cell 22, a bit line pair 24 comprising a true bit line 25 and a complement bit line 26, and a word line 28. Memory array 14 is organized as 128K by 8 bits, but other organizations are possible.

Input portion 12 receives a plurality of address signals labelled "ADDRESS0–ADDRESS19", a chip select signal labelled "$\overline{CS}$", an output enable signal labelled "$\overline{OE}$", and a write signal labelled "$\overline{WE}$". Input portion 12 provides a plurality of column address signals labelled "COLUMN ADDRESS", a plurality of row address signals labelled "ROW ADDRESS", and control signals labelled "WEST", "OEF", "OES", and "PCHG". Row decoder 15 receives ROW ADDRESS and coupled to memory array 14. Memory cell 22 coupled to bit lines 25 and 26 and to word line 38. Memory array 14 provides signals labelled "BL" and "$\overline{BL}$" on bit lines 25 and 26, respectively. Column decoder 17 receives COLUMN ADDRESS, a plurality of bit line signals, including BL and $\overline{BL}$, and couples to sense amplifier portion 16. Sense amplifier portion 16 provides signals labelled "DATA" and "$\overline{DATA}$". Output buffer 18 receives WEST,OEF,OES, $\overline{PCHG}$,DATA, and $\overline{DATA}$, and couples to bonding pad 20.

In memory 10, ROW ADDRESS enables a word line in memory array 14. A memory cell on each of the plurality of bit pairs couples a differential signal indicating a logic state of a stored bit. In column decoder 17, the COLUMN ADDRESS then enables a bit line pair by coupling the bit line pair to a sense amplifier in sense amplifier portion 16, so that a selected memory cell is located at an intersection of the enabled word line and the enabled bit line pair.

Memory 10 has a read mode and a write mode. In the write mode, $\overline{CS}$ and $\overline{WE}$ are asserted and $\overline{OE}$ is negated. ADDRESS0–ADDRESS19 become valid, and a memory cell is selected at an intersection of an enabled word line and an enabled bit line pair. In FIG. 1, memory cell 22 is selected when word line 28 and bit line pair 24 are enabled. When selected in the write mode, a data bit is received on bonding pad 20, is conveyed through an input buffer (not shown), and is provided on bit line pair 24 to be stored in memory cell 22. In the read mode, $\overline{CS}$ and $\overline{OE}$ are asserted and $\overline{WE}$ is negated. A memory cell is selected in the same manner as in the write mode, except in the read mode, memory cell 22 provides a stored bit onto bit lien pair 24 when selected.

Memory 10 uses address transition detection to reduce access time in the read mode. A change in logic state of other control signals also triggers the address transition detection, including a change in $\overline{WE}$ from a logic low to a logic high, and a change in $\overline{CS}$ from a logic high to a logic low. An address transition is detected when one of the address signals changes logic state. Input portion 10 also uses address transition detection to provide WEST,OEF,OES, and $\overline{PCHG}$ to precharge output buffer 18 in advance of the contents of a selected memory cell being driven on DATA and $\overline{DATA}$.

Figure 2:
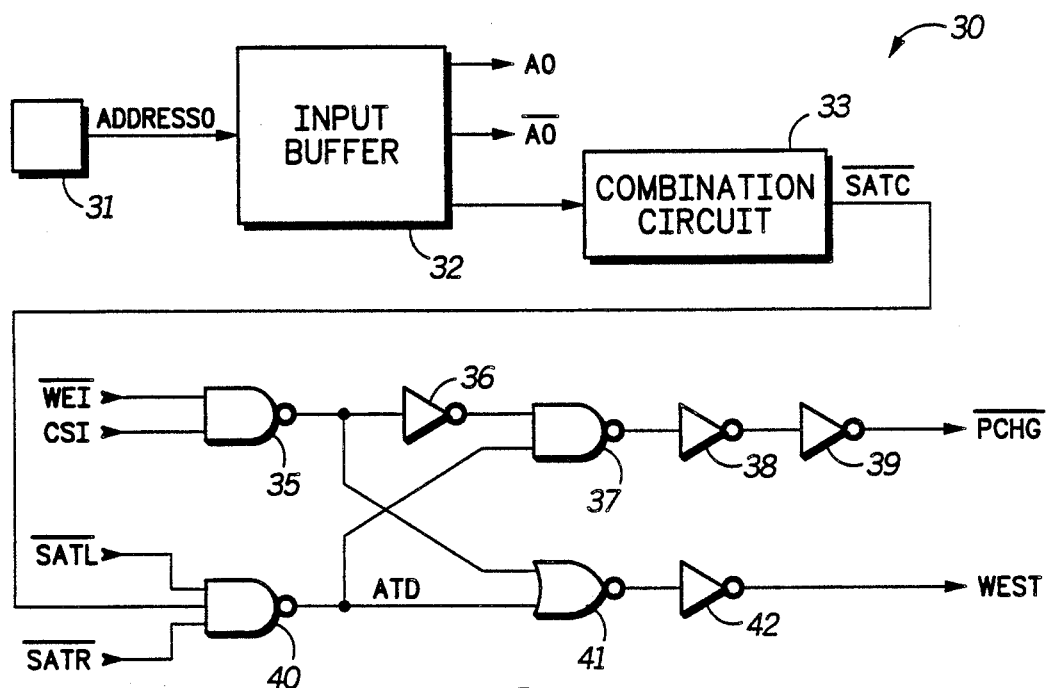
FIG. 2 shows a partial block diagram and a partial schematic of an address transition detection circuit used to generate control signals to the output buffer of FIG. 1.

FIG. 2 shows a partial block diagram and a partial schematic of an address transition detection circuit 30 of input portion 12 of FIG. 1 used to generate control signal to output buffer 18. Circuit 30 provides signals $\overline{PCHG}$ and WEST in response to a transition in an address indicating a new memory access. Circuit 30 comprises a bonding pad 31, an input buffer 32, a combination circuit 33, a NAND gate 35, an inverter 36, a NAND gate 37, an inverter 38, an inverter 39, A NAND gate 40, a NOR gate 41, and an inverter 42. Bonding pad 31 couples ADDRESS0 to input buffer 32, which provides signals labelled "A0" and "$\overline{A0}$", and coupled to combination circuit 33. Combination circuit 33 provides a signal labelled "$\overline{SATC}$" to NAND gate 40. NAND gate 35 has a first input terminal for receiving a signal labelled "$\overline{WEI}$", a second input terminal for receiving a signal labelled "CSI", and an output terminal. Inverter 36 has an input terminal connected to the output terminal of NAND gate 35, and an output terminal. NAND gate 37 has a first input terminal connected to the output terminal of inverter 36, a second input terminal, and an output terminal. Inverter 38 has an input terminal connected to the output terminal of NAND gate 37, and an output terminal. Inverter 39 has an input terminal connected to the output terminal of inverter 38, and an output terminal providing $\overline{PCHG}$. NAND gate 40 has a first input terminal for receiving a signal labelled "$\overline{SATL}$", a second input terminal for receiving $\overline{SATC}$, a third input terminal for receiving a signal labelled "$\overline{SATR}$", and an output terminal connected to the second input terminal of NAND gate 37 and providing a signal labelled "ATD". NOR gate 41 has a first input terminal connected to the output terminal of NAND gate 35, a second input terminal connected to the output terminal of NAND gate 40, and an output terminal. Inverter 42 has an input terminal connected to the output terminal of NOR gate 41, and an output terminal providing WEST.

In operation, circuit 30 provides signals $\overline{PCHG}$ and WEST to output buffer 18 of FIG. 1 in response to a change in address. Note that only ADDRESS0 is shown in circuit 30, and others are omitted but are nonetheless present. Input buffer 32 performs two functions. First it provides true and complement signals for row and column decoding. Second, it provides a signal to combination circuit 33 to indicate a transition in ADDRESS0. Combination circuit 33 receives a plurality of similar address transition detection signals, each provided in response to a transition in a corresponding address signal, and logically combines them into a signal, $\overline{SATC}$, which indicates that any of the plurality of address signals changed. Similar to combination circuit 33, other combination circuits combine address transition detection signals to provide signals $\overline{SATL}$ and $\overline{SATR}$, so that when any address changes to signify a new address presented to the memory, one of $\overline{SATC}$, $\overline{SATL}$, and $\overline{SATR}$ will be asserted. A change in $\overline{WE}$ from logic low to logic high, or a change in $\overline{CS}$ from a logic high to a logic low also causes $\overline{SATL}$ to be asserted.

NAND gate 40 combines these signals and the output terminal of NAND gate 40 is a logic high to indicate such an address transition. Signals $\overline{WEI}$ and CSI are buffered from signals $\overline{WE}$ and $\overline{CS}$, with CSI and $\overline{WEI}$ both in a logic high state to indicate a read access. The output of NAND gate 35 is a logic low to indicate the read cycle. It can be seen that when a read cycle is in progress and an address transition has been detected, then $\overline{PCHG}$ and WEST are asserted. It should be clear that other combinations of logic gates may implement the function of circuit 30 in generating $\overline{PCHG}$ and WEST, as long as the timing of these signals is maintained as will become apparent later.

Figure 3:
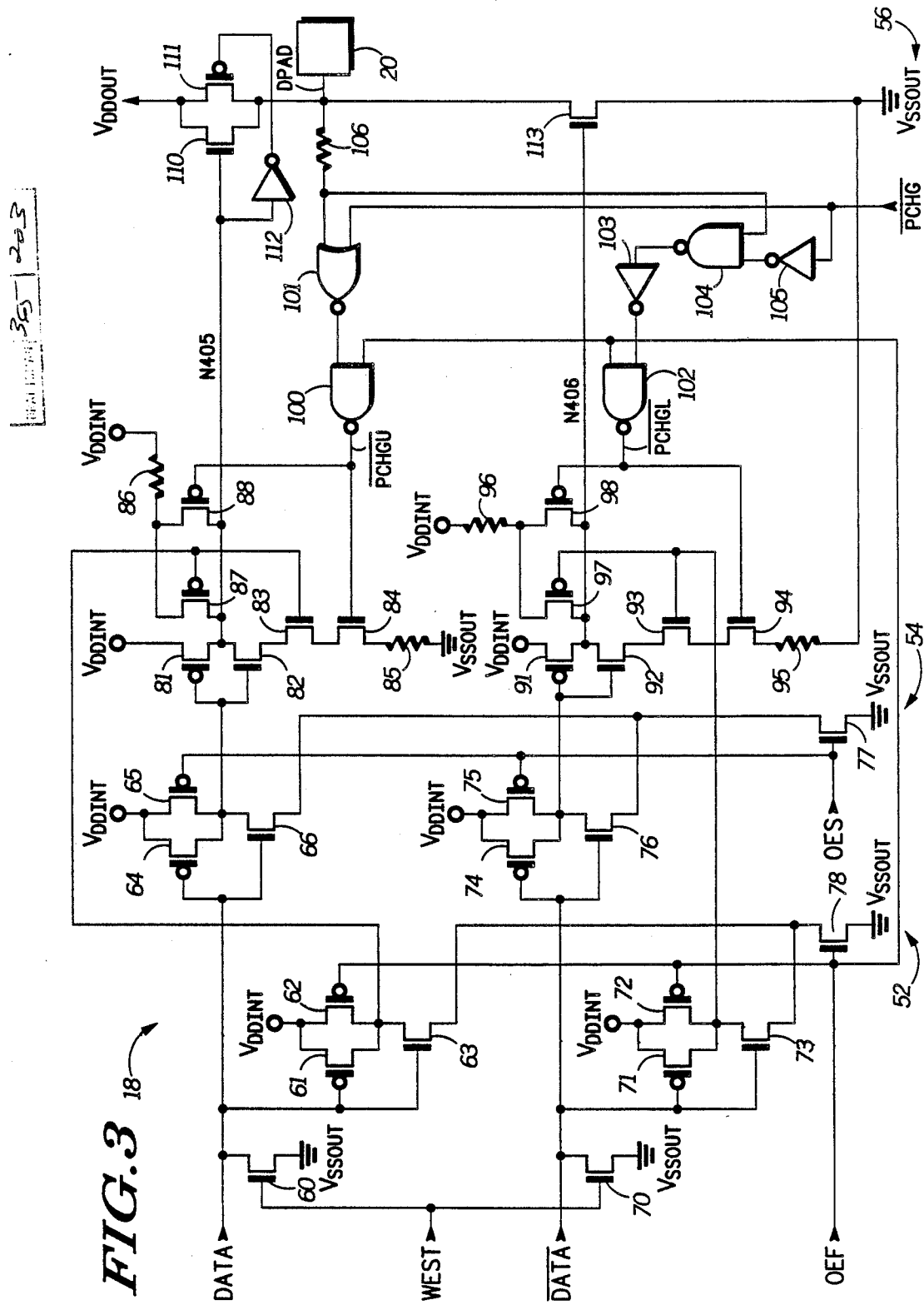
FIG. 3 shows a schematic of an output buffer used in the memory of FIG. 1.

FIG. 3 shows output buffer 18 used in the memory of FIG. 1. Output buffer comprises a select portion 52, a precharge portion 54, and an output stage 56. Also shown in FIG. 2 is bonding pad 20, numbered as in FIG. 1. Select portion 52 comprises an N-channel transistor 60, a P-channel transistor 61, a P-channel transistor 62, an N-channel transistor 63, a P-channel transistor 64, a P-channel transistor 65, an N-channel transistor 66, a N-channel transistor 70, a P-channel transistor 71, a P-channel transistor 72, an N-channel transistor 73, a P-channel transistor 74, a P-channel transistor 75, an N-channel transistor 76, an N-channel transistor 77, and an N-channel transistor 78. Precharge portion 54 comprises a P-channel transistor 81, an N-channel transistor 82, an N-channel transistor 83, and N-channel transistor 84, a resistor 85, a resistor 86, a P-channel transistor 87, a P-channel transistor 88, a P-channel transistor 91, an N-channel transistor 92, an N-channel transistor 93, an N-channel transistor 94, a resistor 95, a resistor 96, a P-channel transistor 97, a P-channel transistor 98, a NAND gate 100, a NOR gate 101, a NAND gate 102, an inverter 103, a NAND gear 104, and an inverter 105, and a resistor 106. Output stage 56 comprises an N-channel transistor 1190, a P-channel transistor 111, an inverter 112, and an N-channel transistor 113.

In a select portion 52, transistor 60 has a first current electrode connected to DATA, a control electrode for receiving WEST, and a second current electrode connected to a power supply voltage terminal labelled "$V_{SSOUT}$". $V_{SSOUT}$ is a negative power supply voltage terminal and is approximately 0 volts. Transistor 61 has a first current electrode connected to a power supply voltage terminal labelled "$V_{DDINT}$", a control electrode connected to DATA, and a second current electrode. $V_{DDINT}$ is a positive power supply voltage terminal and is approximately 5 molts. Transistor 62 has a first current electrode connected to $V_{DDINT}$, a control electrode for receiving a signal labelled "OEF", and a second current electrode connected to the second current electrode of transistor 61. Transistor 63 has a first current electrode connected to the second current electrode of transistor 61, a control electrode for receiving DATA, and a second current electrode. Transistor 64 has a first current electrode connected to $V_{DDINT}$, a control electrode for receiving DATA, and a second current electrode. Transistor 65 has a first current electrode connected to $V_{DDINT}$, a control electrode for receiving a signal labelled "OES", and a second current electrode connected to the second current electrode of transistor 64. Transistor 66 has a first current electrode connected to the second current electrode of transistor 64, a control electrode for receiving DATA, and a second current electrode.

Transistor 70 has a first current connected to $\overline{DATA}$, a control electrode for receiving WEST, and a second current electrode connected to $V_{SSOUT}$. Transistor 71 has a first current electrode connected to $V_{DDINT}$, a control electrode connected to $\overline{DATA}$, and a second current electrode. Transistor 72 has a first current electrode connected to $V_{DDINT}$, a control electrode for receiving OEF, and a second current electrode connected to the second current electrode of transistor 71. Transistor 73 has a first current electrode connected to the second current electrode of transistor 71, a control electrode for receiving $\overline{DATA}$, and a second current electrode. Transistor 74 has a first current electrode connected to $V_{DDINT}$, a control electrode for receiving $\overline{DATA}$, and a second current electrode. Transistor 75 has a first current electrode connected to $V_{DDINT}$, a control electrode for receiving OED, and a second current electrode connected to the second current electrode of transistor 74. Transistor 76 has a first current electrode connected to the second current electrode of transistor 75, a control electrode for receiving $\overline{DATA}$, and a second current electrode.

Transistor 77 has a first current electrode connected t the second current electrode of transistor 66 and to the second current electrode of transistor 76, a control electrode for receiving OES, and a second current electrode connected to $V_{SSOUT}$. Transistor 78 has a first current electrode connected to the second current electrode of transistor 63 and to the second current electrode of transistor 73, a control electrode for receiving OEF, and a second current electrode connected to $V_{SSOUT}$.

In precharge portion 54, transistor 81 has a first current electrode connected to $V_{DDINT}$, a control electrode connected to the second current electrode of transistor 64, and a second current electrode connected to a node labelled "N405". Transistor 82 has a first current electrode connected to the second current electrode of transistor 81, a control electrode connected to the second current electrode of transistor 64, and a second current electrode. Transistor 83 has a first current electrode connected to the second current electrode of transistor 82, a control electrode connected to the second current electrode of transistor 61, and a second current electrode. Transistor 84 has a first current electrode connected to the second current electrode of transistor 83, a control electrode for receiving a signal labelled $\overline{PCHGU}$, and a second current electrode. Resistor 85 has a first terminal connected to the second current electrode of transistor 84, and a second terminal connected to $V_{SSOUT}$. Resistor 86 has a first terminal connected to $V_{DDINT}$, and a second terminal. Transistor 87 has a first current electrode connected to the second terminal of resistor 86, as control electrode connected to the second current electrode of transistor 61, and a second current electrode connected to node N405. Transistor 88 has a first current electrode connected to the second terminal of resistor 86, a control electrode for receiving $\overline{PCHGU}$, and a second current electrode connected to node N405.

Transistor 91 has a first current electrode connected to $V_{DDINT}$, a control electrode connected to the second current electrode of transistor 74, and a second current electrode connected to a node labelled "N406". Transistor 92 has a first current electrode connected to the second current electrode of transistor 91, a control electrode connected to the second current electrode of transistor 74, and a second current electrode. Transistor 93 has a first current electrode connected to the second current electrode of transistor 92, a control electrode connected to the second current electrode of transistor 71, and a second current electrode. Transistor 94 has a first current electrode connected t the second current electrode of transistor 93, a control electrode for receiving a signal labelled $\overline{PCHGL}$, and a second current electrode. Resistor 95 has a first terminal connected to the second current electrode of transistor 94, and a second terminal connected to $V_{SSOUT}$. Resistor 96 has a first terminal connected to $V_{DDINT}$, and a second terminal. Transistor 97 has a first current electrode connected to the second terminal of resistor 96, a control electrode connected to the second current electrode of transistor 71, and a second current electrode connected to node N406. Transistor 98 has a first current electrode connected to the second terminal of resistor 96, a control electrode for receiving $\overline{PCHGL}$, and a second current electrode connected to node N406.

NAND gate 100 has a first input terminal, a second input terminal for receiving OES, and an output terminal for providing $\overline{PCHGU}$. NOR gate 101 has a first input terminal, a second input terminal for receiving $\overline{PCHG}$, and an output terminal connected to the first input terminal of NAND gate 100. NAND gate 102 has a first input terminal for receiving OEF, a second input terminal, and an output terminal for providing $\overline{PCHGL}$. Inverter 103 has an input terminal, and an output terminal connected to the second input terminal of NAND gate 102. NAND gate 104 has a first input terminal, a second input terminal, and an output terminal connected to the input terminal of NAND gate 102. Inverter 105 has an input terminal for receiving $\overline{PCHG}$, and an output terminal connected to the second input terminal of NAND gate 104. Resistor 106 has a first input terminal connected to bonding pad 20 on a node labelled "DPAD", and a second terminal connected to the first input terminal of NOR gate 101 and the first input terminal of NAND gate 104.

In output stage 56, transistor 110 has a first current electrode connected to a power supply power terminal labelled "$V_{DDOUT}$", a control electrode connected to node N405, and a second current electrode connected to node DPAD. $V_{DDOUT}$ is a positive power supply voltage terminal and is approximately 5 volts. Transistor 111 has a first current electrode connected to $V_{DDOUT}$, a control electrode, and a second current electrode connected to node DPAD. Inverter 112 has an input terminal connected to node N405, and an output terminal connected to the control electrode of transistor 111. Transistor 113 has a first current electrode connected to node PDAD, a control electrode connected to node N405, and a second current electrode connected to $V_{SSOUT}$.

To understand the operation of output buffer 18, first note that two positive power supply voltage terminals, $V_{DDINT}$ and $V_{DDOUT}$, are provided. $V_{DDINT}$ is a power supply voltage terminal used for internal circuitry and is not used for output buffers to protect the internal circuits from excessive current transients that accompany power supply voltage terminals connected to output buffers. On the other hand, $V_{DDOUT}$ is a power supply voltage terminal connected to output buffers.

Output buffer 18 has three stages, select portion 52, precharge portion 54, and output stage 56. First, output buffer 18 is disabled when WEST is asserted. When WEST is asserted, the control electrodes of transistor 61, 63, 64, 66, 71, 73, 74, and 76 are connected to $V_{SSOUT}$ and DPAD is placed in a high impedance state. OEF enables output buffer 18 by making pullup transistors 62 and 72 nonconductive and pulldown transistor 78 conductive. OES enables output buffer 18 by making transistors 65 and 75 nonconductive and transistor 77 conductive. OEF is a buffered active-high signal provided after $\overline{OE}$ is asserted to memory 10. OES is a buffered active high signal provided after $\overline{OE}$ and delayed from OEF. When DATA and $\overline{DATA}$ become valid by a differential voltage developing between the two signals, the second current electrodes of transistors 64 and 74 invert signals DATA and $\overline{DATA}$, respectively. Circuits in precharge portion 54 are also enabled by the second current electrodes of transistors 61 and 71.

Precharge portion 54 performs two functions. First, before DATA and $\overline{DATA}$ become valid, either $\overline{PCHGU}$ or $\overline{PCHGL}$ is provided if a sensed voltage on DPAD is not within a specified range to ensure the voltage on DPAD is within the specified range. Note that when memory 10 is accessed, the voltage on DPAD at the beginning of the access cycle is determined by the voltage provided on DPAD during a previous cycle. During the previous cycle, memory 10 or another device sharing the same data bus with memory 10 may have driven the voltage on DPAD to a either logic high or a logic low. A worst case condition occurs when output buffer 18 must provide the voltage on DPAD in an opposite logic state than was provided during the previous cycle.

Second, precharge portion 54 provides an inversion and level boosting function as a predriver to output stage 56. Note that precharge portion 54 uses internal power supply $V_{DDINT}$ to prevent switching noise of output stage 56 from being reflected in precharge portion 54. Precharge portion 54 employs resistors 85, 86, 95, and 96 in series with the power supply voltage terminals to prevent fast switching of precharge portion 54, which also improves di/dt.

Either $\overline{PCHGU}$ or $\overline{PCHGL}$ is asserted if a sensed voltage on PDAD is not within the specified range during a precharge period. The specified range is approximately from a maximum logic low voltage to a minimum logic high voltage, and in the preferred embodiment is approximately from 1 volt to 2 volts. The precharge period occurs when $\overline{PCHG}$ is asserted after the start of a read cycle. When the precharge period ends, WEST and $\overline{PCHG}$ are negated, a differential voltage develops between DATA and $\overline{DATA}$, and a data period begins. Since the voltage on DPAD is continuously sensed during the precharge period, if the action of either $\overline{PCHGU}$ or $\overline{PCHGL}$ brings the voltage on DPAD within the specified range, further precharging will cease. SIgnal OEF enables the generation of $\overline{PCHGU}$ or $\overline{PCHGL}$ by providing a logic high on an input terminal of both NAND gates 100 and 012, which allows the output of NAND gates 100 and 102 to be determined by the voltage on the other respective input terminals.

A sensed voltage on DPAD greater than a threshold of approximately 2 volts during the precharge period causes $\overline{PCHGL}$ to be asserted as a logic low. The logic low on the control electrode of transistor 98 makes transistor 98 conductive, which provides a logic high on the control electrode of transistor 113. Transistor 113 is made conductive, resistively coupling DPAD to $V_{SSOUT}$. The rate at which the voltage on DPAD decreases depends on the amount of capacitance on bonding pad. 20. However, when the voltage on DPAD becomes low enough, below approximately 2 volts, $\overline{PCHGL}$ is negated, and transistors 98 and 113 become nonconductive. Since there is a delay between the voltage on DPAD reaching 2 volts and transistor 113 becoming nonconductive, the voltage on DPAD falls below 2 volts before precharging ceases.

A sensed voltage on DPAD less than a threshold of approximately 1 volt during the precharge period causes $\overline{PCHGU}$ to be asserted as a logic low. The logic low on the control electrode of transistor 88 makes transistor 88 conductive, which provides a logic high on the control electrode of transistor 110 and a logic low on the control electrode of transistor 111. Transistors 110 and 111 are made conductive, and resistively coupled DPAD to $V_{DDOUT}$. The rate at which the voltage on DPAD increases depends on the amount of capacitance on bonding pad 20. However, when the voltage on PDAD becomes high enough, above approximately 1 volt. $\overline{PCHGU}$ is negated, and transistors 88, 110, and 111 become nonconductive. Since there is a delay between the voltage on DPAD reaching 1 volt and transistors 110 and 111 becoming nonconductive, the voltage on PDAD rises above 1 volt before precharging ceases.

Thus, only one of signals $\overline{PCHGU}$ and $\overline{PCHGL}$ can be asserted at any given time. If the output is within the specified range then neither are asserted. The pulldown driver, transistor 113, and the pull-up driver, transistors 110 and 111, are thus conveniently used to bring the output to within the specified range but without causing both the pull-up and pull-down drivers to be conductive at the same time. The advantage of presetting the output to an intermediate voltage just prior to the high speed switching is thus achieved without adding capacitance to the output and without any steady state current drain which would be required by a reference voltage. Furthermore, because the output is sensed, there is no precharge current to or from the output if the output is already in the desired voltage range.

An output buffer of a memory causes an Ldi/dt voltage drop between an internal power supply voltage terminal and a corresponding external power supply voltage terminal, when the data output signal is provided during a read access. If the Ldi/dt voltage drop is large enough, circuit malfunction may result. In output buffer 18, at the end of the precharge period, the voltage on DPAD is substantially between a logic low voltage and a logic high voltage. By precharging the voltage on PDAD, output buffer 18 reduces the change in voltage and di/dt during the subsequent data period. The values of resistors 86 and 96 affect the size of the Ldi/dt drop during the precharge period and therefore the data period, and should be adjusted until the worst case di/dt is minimized. There s a tradeoff between speed and di/dt, and since si/dt is reduced for a given speed of the memory, speed may be improved until a maximum tolerable di/dt is reached.

Output stage 56 receives signals on nodes N405 and N406 from precharge portion 54 and provides a voltage on PDAD in response. When DATA is valid, node N405 is in the same logic state as DATA, although the voltage level is increased. When the voltage of DATA is positive with respect to $\overline{DATA}$, a logic high voltage is provided on the control electrode of transistor 110, and a logic low voltage is provided on the control electrode of transistor 111, making both transistor 110 and transistor 111 conductive and coupling DPAD substantially to $V_{DDOUT}$. Node N406 is provided in a low log state and transistor 113 is nonconductive. Alternatively, if DATA is negative with respect to $\overline{DATA}$, node N405 is a logic low and transistors 110 and 111 are nonconductive. Node N406 makes transistors 113 conductive, and DPAD is substantially coupled to $V_{SSOUT}$.

Figure 4:
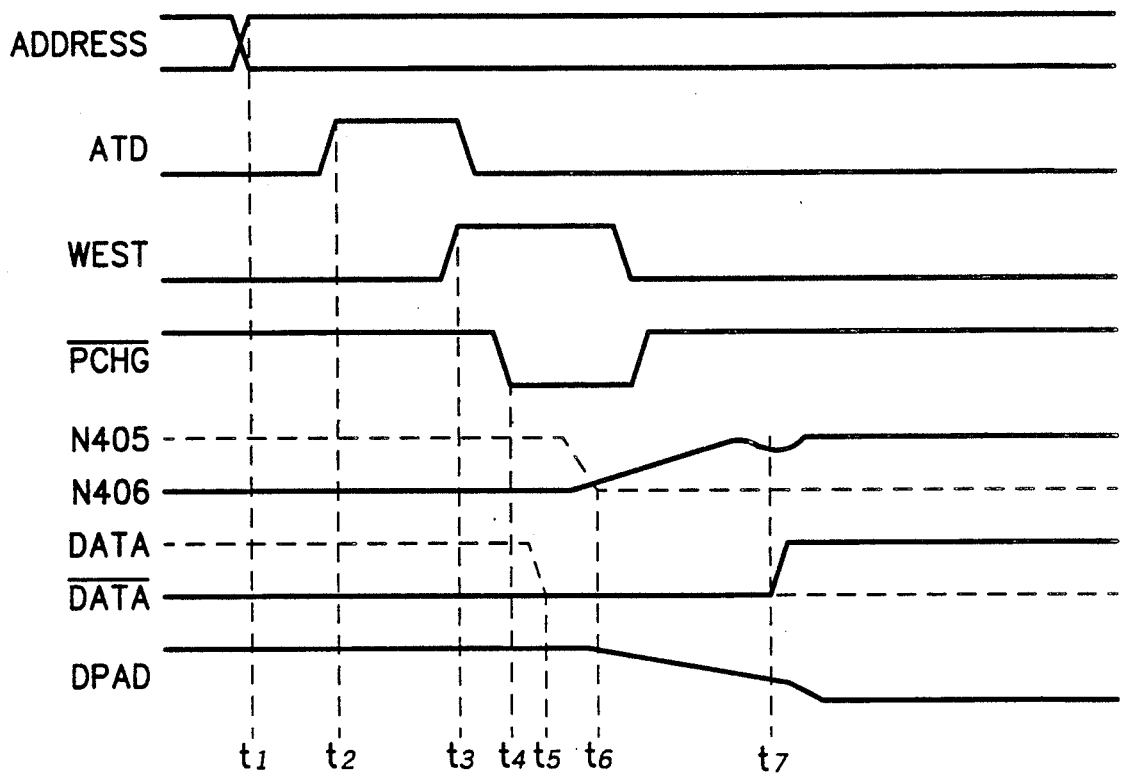
FIG. 4 shows a timing diagram of control signals used in FIG. 2.

FIG. 4 shows a timing diagram of control signals used in output buffer 18 of FIG. 1 and FIG. 2. At time t1, an address asserted to the memory changes. A short time later, at t2, ATD is asserted. SOme time later at t3, due to propagation through logic gates 41 and 52, WEST is asserted and shortly thereafter, at t4, $\overline{PCHG}$ is asserted. When $\overline{PCHG}$ is asserted, signalling a precharge period of the memory, precharge circuit 54 of FIG. 3 begins sampling the voltage on DPAD and providing a voltage thereon in response to the sensed voltage. When $\overline{PCHG}$ is asserted, the voltage on DPAD begins to be driven to a level between a logic high and a logic low. In the example shown here, DPAD was a logic high, and the data bit signalled by DATA and $\overline{DATA}$ is a logic low. Before providing a logic low differentially, DATA and $\overline{DATA}$ are both provided at a logic low at t5. In response, nodes N405 and N406 are also both driven to a logic low at t6. However, because of the assertion of $\overline{PCHG}$ and a voltage sensed on DPAD at a logic high, the voltage on N406 begins to rise. $\overline{PCHG}$ is subsequently negated, signalling the end of the precharge period and the beginning of the data period, and finally at t7, DATA and $\overline{DATA}$ begin to separate and voltage on nodes N405 and N406, and then the voltage on DPAD, are driven to reflect the value of the bit stored in the selected memory cell.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. An integrated circuit memory comprising:
a plurality of memory cells located at intersections of a plurality of word lines and a plurality of bit line pairs, each memory cell selected by an enabled word line and an enabled bit line pair, and providing a pair of complementary bit line signals when selected;
row decoding means coupled to said word lines, for enabling a word line in response to a plurality of row address signals;
column decoding means coupled to said plurality of bit line pairs, for enabling a bit line pair in response to a plurality of column address signals;
address transition detection means, for providing first and second precharge signals in response to a change in logic state of either, at lest one of said plurality of row address signals and said plurality of column address signals, or at least one control signal, said second precharge signal being provided after said first precharge signal; and
output buffer means, coupled to said column decoding means and to said address transition detection means, for providing a data output signal at a voltage substantially between a logic high voltage and a logic low voltage in response to said second precharge signal and a sensed voltage on said data output signal, and for providing said data output signal at either said logic high voltage or said logic low voltage corresponding to a voltage on said enabled bit line pair in response to a negation of said first precharge signal.

2. The integrated circuit memory of claim 1 wherein said output buffer means comprises:
a selected circuit, for providing first and second signals responsive to first and second bit lines of said enabled bit line pair;
a precharge circuit coupled to said select circuit, for providing third and fourth signals responsive to said sensed voltage of said data output signal during a precharge period, and responsive to said first and second signals otherwise; and
an output drive circuit, for providing said data output signal in response to said third and fourth signals.

3. The integrated circuit memory of claim 2 wherein said select circuit provides said first signal in a logic state opposite a logic state of a first bit line of said bit line pair and provides said second signal in a logic state opposite a logic state of a second bit line of said bit line pair, in response to first and second control signals, after a negation of said first precharge signal.

4. The integrated circuit memory of claim 2 wherein said precharge circuit comprises:
precharge means, for providing second and third and precharge signals in response to said sensed voltage on said data output signal when said precharge signal is in a first logic stage; and
drive means coupled to said precharge means, for providing said third signal in a second logic state in response to said second precharge signal during said precharge period and in a logic state opposite a logic state of said first signal otherwise, and for providing said fourth signal in a second logic state in response to said third precharge signal during said precharge period and in a logic state opposite a logic state of said second signal otherwise.

5. The integrated circuit memory of claim 4 wherein said second precharge signal is provided in response to said sensed voltage of said data output signal being below a first threshold, and wherein said third precharge signal is provided in response to said sensed voltage of said data output signal being above a second threshold.

6. The integrated circuit memory of claim 5 wherein said precharge means is enabled by a control signal.

7. The integrated circuit memory of claim 6 wherein said precharge means comprises:
   a resistor, having a first terminal coupled to said data output signal, and a second terminal;
   a first inverter, having an input terminal for receiving said second precharge signal, and an output terminal;
   a first NAND gate, having a first input terminal coupled to said output terminal of said first inverter, a second input terminal coupled to said second current electrode of said resistor, and an output terminal;
   a second inverter, having an input terminal coupled to said output terminal of said first NAND gate, and an output terminal;
   a second NAND gate, having a first input terminal coupled to said output terminal of said second inverter, a second input terminal coupled to said control signal, and an output terminal for providing said third precharge signal;
   a NOR gate, having a first input terminal for receiving said second precharge signal, a second input terminal coupled t said second terminal of said resistor, and an output terminal; and
   a third NAND gate, having a first input terminal for receiving said control signal, a second input terminal coupled to said output terminal of said NOR gate, and an output terminal for providing said second precharge signal.

8. The integrated circuit memory of claim 1, wherein said data output signal is coupled to a bonding pad, said bonding pad providing a point for connection external to the integrated circuit memory.

9.; A memory comprising:
   data storage means, for storing a predetermined number of data bits at an address determined by a plurality of address signals during a write cycle of the memory, and for providing said predetermined number of data bits on corresponding bit line pairs in response to said address when enabled during a read cycle of the memory;
   address transition detection means, for receiving said plurality of address signals, and for providing first and second precharge signals in response to a change in logic state of at least one of said address signals, said second precharge signal being asserted after said first precharge signal;
   a select circuit, for providing first and second signals responsive respectively to first and second bit lines of said enabled bit line pair in response to a first output enable signal, and for providing third and fourth signals responsive respectively to said first and second bit lines of said enabled bit line pair in response to a second output enable signal, said second output enable signal delayed from said first output enable signal;
   a precharge circuit coupled to said select circuit, for providing fifth and sixth signals responsive to a sensed voltage of said data output signal during a precharge period, and responsive to said first and second signals otherwise; and
   an output drive circuit coupled to said precharge circuit, for providing said data output signal in response to said fifth and sixth signals.

10. The memory of claim 9, wherein said select circuit comprises:
    first inversion means, for providing said first signal as a logical inverse of a voltage on said first line when said first output enable signal is asserted;
    second inversion means, for providing said second signal as a logic inverse of a voltage on said second bit line when said first output enable signal is asserted;
    third inversion means, for providing said third signal as a logical inverse of a voltage on said first bit line when said second output enable signal is asserted; and
    fourth inversion means, for providing said fourth signal as a logic inverse of a voltage on said second bit line when said second output enable signal is asserted.

11. The memory of claim 10 wherein said precharge means comprises:
    fifth inversion means, for providing said fifth signal in response to a logical inversion of either said first signal or said third signal when a seventh signal is asserted;
    sixth inversion means, for providing said sixth signal in response to a logical inversion of either said second signal on said fourth signal when an eighth signal is asserted; and
    a precharge selection circuit, coupled to said fifth and sixth inversion means, for providing said seventh signal in response to said data output signal being above a predetermined voltage during said precharge period, and for providing said eighth signal in response to said data output signal being below said predetermined voltage during said precharge period.

12. The memory of claim 11 wherein said fifth inversion means comprises:
    a first transistor having a first current electrode coupled to a power supply voltage terminal, a control electrode for receiving said third signal, and a second current electrode for providing said fifth signal;
    a second transistor having a first current electrode coupled to said second current electrode of said first transistor, a control electrode for receiving said third signal, and a second current electrode;
    a third transistor having a first current electrode coupled to said second current electrode of said second transistor, a control electrode for receiving said first signal, and a second current electrode;
    a fourth transistor having a first current electrode coupled to said second current electrode of said third transistor, a control electrode for receiving said seventh signal, and a second current electrode;
    a first resistor having a first terminal coupled to said second current electrode of said fourth transistor, and a second current electrode coupled to a second power supply voltage terminal;

a second resistor having a first terminal coupled to said first power supply voltage terminal, and a terminal;

a fifth transistor having a first current electrode coupled to said second terminal of said second resistor, a control electrode for receiving said first signal, and a second current electrode coupled to said second current electrode of said first transistor; and a sixth transistor having a first current electrode coupled to said second terminal of said second resistor, a control electrode for receiving said seventh signal, and a second current electrode coupled to said second current electrode of said first transistor.

13. In a memory, an output buffer comprising:

a select circuit, for providing first and second signals responsive respectively to first and second data input signals in response to a first output enable signal, and for providing third and fourth signals responsive respectively to said first and second data signals in response to a second output enable signal, said second output enable signal delayed from said first output enable signal;

a precharge circuit coupled to said select circuit, for providing fifth and sixth signals responsive to a sensed voltage of said data output signal during a precharge period, and responsive to said first and second signals otherwise; and an output drive circuit coupled to said precharge circuit, for providing said data output signal in response to said fifth and sixth signals;

said precharge circuit comprising:

a resistor, having a first terminal coupled to said data output signal, and a second terminal;

a first inverter, having an input terminal for receiving said precharge signal, and an output terminal;

a first NAND gate, having a first input terminal coupled to said output terminal of said first inverter, a second input terminal coupled to said second current electrode of said resistor, and an output terminal;

a second inverter, having an input terminal coupled to said output terminal of said first NAND gate, and an output terminal;

a second NAND gate, having a first input terminal coupled to said output terminal of said second inverter, a second input terminal coupled to said control signal, and an output terminal for providing said third precharge signal;

a NOR gate, having a first input terminal for receiving said precharge signal, a second input terminal coupled to said second terminal of said resistor, and an output terminal; and a third NAND gate, having a first input terminal for receiving said control signal, a second input terminal coupled to said output terminal of said NOR gate, and an output terminal for providing said second precharge signal.

* * * * *

UNITED STATES PATENT AND TRADEMARK OFFICE
CERTIFICATE OF CORRECTION

PATENT NO. : 4,991,140
DATED : February 5, 1991
INVENTOR(S) : Karl L. Wang; Ray Chang It is certified that error appears in the above-identified patent and that said Letters Patent is hereby corrected as shown below:

COLUMN 12:

In claim 10 at line 15, insert --bit-- after "first".

In claim 10 at line 18, change "logic" to --logical--.

In claim 10 at line 26, change "logic" to --logical--.

In claim 11 at line 37, change "on" to --or--.

Signed and Sealed this

Sixth Day of October, 1992

Attest:

DOUGLAS B. COMER

*Attesting Officer*     *Acting Commissioner of Patents and Trademarks*